United States Patent
Jiang et al.

(10) Patent No.: US 10,139,444 B2
(45) Date of Patent: Nov. 27, 2018

(54) SENSING CIRCUIT, SENSING DEVICE AND MONITORING SYSTEM FOR POWER TRANSMISSION LINES

(71) Applicant: NATIONAL TAIWAN UNIVERSITY, Taipei (TW)

(72) Inventors: Joe-Air Jiang, Taipei (TW); Xiang-Yao Zheng, Taichung (TW); Chien-Hao Wang, Keelung (TW); Yu-Cheng Yang, Taipei (TW); Ching-Ya Tseng, New Taipei (TW)

(73) Assignee: NATIONAL TAIWAN UNIVERSITY, Taipei (TW)

( * ) Notice: Subject to any disclaimer, the term of this patent is extended or adjusted under 35 U.S.C. 154(b) by 66 days.

(21) Appl. No.: 15/333,364

(22) Filed: Oct. 25, 2016

(65) Prior Publication Data

US 2017/0285091 A1 Oct. 5, 2017

Related U.S. Application Data

(60) Provisional application No. 62/314,560, filed on Mar. 29, 2016.

(51) Int. Cl.
*G01R 31/08* (2006.01)
*H02J 3/38* (2006.01)
(Continued)

(52) U.S. Cl.
CPC ......... *G01R 31/085* (2013.01); *G01R 15/181* (2013.01); *H02J 3/383* (2013.01);
(Continued)

(58) Field of Classification Search
CPC .......................... G01R 31/1272; G01R 31/026; G01R 31/021; G01R 31/025; G01R 31/11
(Continued)

(56) References Cited

U.S. PATENT DOCUMENTS 2,474,988 A * 7/1949 Sargrove .................. H05K 1/16
174/260
4,258,348 A * 3/1981 Belfer ..................... H01F 38/30
336/105
(Continued)

FOREIGN PATENT DOCUMENTS

TW 540203 7/2003
TW 201042880 A1 12/2010
(Continued)

*Primary Examiner* — Jermele M Hollington
*Assistant Examiner* — Christopher McAndrew
(74) *Attorney, Agent, or Firm* — Li & Cai Intellectual Property (USA) Office

(57) ABSTRACT

A sensing device for power transmission line includes an induction coil device, a sensing circuit device, and a housing. A plurality of iron cores and a plurality of windings defined in the induction coil device. The windings are wound around the iron cores. A hole for power transmission line is defined in the induction coil device. The sensing circuit device detects operation status of a power transmission line and environmental parameters. The sensing circuit device includes a cover and a bottom plate. Multiple circuit boards are mounted on the bottom plate. The induction coil device is mounted on one side of the cover. Each of two ends of the housing has a streamline shape. The housing is hollow for receiving the sensing circuit device. The iron cores of the induction coil device includes at least one first iron core and at least one second iron core.

7 Claims, 10 Drawing Sheets

(51) Int. Cl.
  *G01R 15/18* (2006.01)
  *H02J 7/02* (2016.01)
  *H02J 7/35* (2006.01)
  *H02J 13/00* (2006.01)

(52) U.S. Cl.
  CPC .................................. *H02J 7/02* (2013.01); *H02J 7/35* (2013.01); *H02J 13/0075* (2013.01); *Y02E 10/563* (2013.01); *Y02E 10/566* (2013.01); *Y02E 40/72* (2013.01); *Y02E 60/74* (2013.01); *Y02E 60/7853* (2013.01); *Y04S 10/123* (2013.01); *Y04S 10/30* (2013.01); *Y04S 40/126* (2013.01)

(58) Field of Classification Search
  USPC ......................................................... 324/543
  See application file for complete search history.

(56) References Cited

U.S. PATENT DOCUMENTS

| | | | | |
|---|---|---|---|---|
| 4,268,818 A * | 5/1981 | Davis | ................. | G01K 1/024 174/146 |
| 4,601,765 A * | 7/1986 | Soileau | ............... | H01F 41/0246 148/104 |
| 4,709,339 A * | 11/1987 | Fernandes | ............. | G01K 1/024 324/127 |
| 4,758,962 A * | 7/1988 | Fernandes | ............. | G01K 1/024 324/127 |
| 4,801,937 A * | 1/1989 | Fernandes | ............. | G01R 15/142 323/357 |
| 4,847,780 A * | 7/1989 | Gilker | .................. | G01R 15/186 702/64 |
| 4,855,671 A * | 8/1989 | Fernandes | ............. | G01K 1/024 324/127 |
| 5,502,374 A * | 3/1996 | Cota | .................... | G01R 15/186 324/119 |
| 5,521,572 A * | 5/1996 | Goodwin | ................ | H01F 38/30 336/175 |
| 6,054,329 A * | 4/2000 | Burghartz | ........... | H01F 17/0006 336/200 |
| 7,034,645 B2 * | 4/2006 | Shafer | .................... | H01F 17/04 29/602.1 |
| 7,795,877 B2 * | 9/2010 | Radtke | ............. | G01R 19/16547 324/530 |
| 8,806,694 B2 * | 8/2014 | Davis | .................... | A46B 9/028 15/104.04 |
| 9,146,259 B2 * | 9/2015 | Blake | .................. | G01R 15/186 |
| 9,368,275 B2 * | 6/2016 | McBee | .................. | H01F 27/06 |
| 9,684,016 B2 * | 6/2017 | Dames | ................ | G01R 15/186 |
| 2004/0257061 A1 * | 12/2004 | George de Buda | . | G01R 15/186 324/117 R |
| 2008/0122642 A1 * | 5/2008 | Radtke | ............. | G01R 19/16547 340/660 |
| 2010/0237853 A1 * | 9/2010 | Bose | .................. | G01R 33/025 324/117 H |
| 2012/0074899 A1 * | 3/2012 | Tsai | ........................ | H02J 5/005 320/108 |
| 2012/0271570 A1 * | 10/2012 | Paik | ...................... | G01D 4/004 702/57 |
| 2015/0061578 A1 | 3/2015 | Keeling et al. | | |

FOREIGN PATENT DOCUMENTS

| | | |
|---|---|---|
| TW | 201347349 A | 11/2013 |
| TW | 201509051 A | 3/2015 |

* cited by examiner

SENSING CIRCUIT, SENSING DEVICE AND MONITORING SYSTEM FOR POWER TRANSMISSION LINES

BACKGROUND

1. Technical Field

The present disclosure relates to a sensing device and a monitoring system for power transmission lines, more particularly to a sensing device for power transmission lines and a monitoring system for power transmission lines with real-time monitoring and independent power sources.

2. Description of Related Art

Existing power grids use a plurality of transmission towers for delivering the electrical energy to a relay tower. In general, the transmission towers are mostly located in mountainous areas, coastal areas or mountain slopes. Due to some damages of caused by climate, such as mudslides or landslides caused by typhoons or earthquakes, soil erosion may occur around the transmission towers. The transmission towers could tilt or collapse, such that power outages occur. In addition, vibrations of the power transmission lines are caused by strong wind at higher places. Moreover, resonance phenomena between the power transmission lines could occur such that one of the power transmission lines breaks causing a power outage or damage. In general, the positions of the transmission towers, such as seaside or mountainous areas, have a high humidity environment or a high salt environment. The power transmission lines and the transmission towers rapidly age. Moreover, the DIV power transmission lines easily overheat when high energy is delivered, such that a line sag phenomena occurs. Thus, the sagging power transmission line could easily contact with buildings or other equipment.

A routine patrol is used for resolving the above issues using a lot of human resources. On the other hand, the applications related to the method and device of remote monitoring system also have some deficiencies, which are necessary to be improved.

SUMMARY

The embodiment of the present disclosure provides a sensing device for power transmission lines. The sensing device for power transmission lines includes an induction coil device, a sensing circuit device and a housing. A plurality of iron cores and a plurality of windings are defined in the induction coil device. The windings are wound around the iron cores. A hole for power transmission line is defined at the induction coil device. The sensing circuit device detects the operation status of a power transmission line and environmental parameters. The sensing circuit device includes a cover and a bottom plate. Multiple circuit boards are mounted on the bottom plate. The induction coil device is mounted on one side of the cover. Each of two ends of the housing has a streamline shape. The housing is hollow for receiving the sensing circuit device. The iron cores of the induction coil device include at least one first iron core and at least one second iron core. The first iron core is straight. The second iron core includes a first section, a second section and a third section. The second section is connected between the first section and the third section in a U-shaped manner. Each of the windings is wound around each of the first iron cores or each of the second iron cores.

An embodiment of the present disclosure provides a sensing circuit mounted in a sensing device for power transmission lines. The sensing circuit includes a plurality of induction power sources, a solar photovoltaic module, a protection circuit, a first filter, a second filter, a power control unit, a first battery, a second battery, a first charger, a second charger, a central processing unit, a video recording module, a sensor module, a wireless communication module and an antenna. The protection circuit is electrically connected to the induction power sources for avoiding damage caused by spike voltage, lightning, or an overcurrent situation. The first filter is electrically connected to the protection circuit for filtering an output electrical energy of the induction power sources. The second filter is electrically connected to the solar photovoltaic module for filtering an output electrical energy of the solar photovoltaic module. The power control unit is electrically connected to the first filter and the second filter for controlling the electrical energy provided to the sensing circuit. The first battery is electrically connected to the power control unit for being a first backup power source. The second battery is electrically connected to the power control unit for being a second backup power source. The first charger is electrically connected to the first filter and the first battery for charging the first battery. The second charger is electrically connected to the second filter and the second battery for charging the second battery. The central processing unit is electrically connected to the power control unit, controlling the sensing circuit and executing computations thereof. The video recording module is electrically connected to the central processing unit, generating a plurality of image signals and transmitting the image signals to the central processing unit. The sensor module is electrically connected to the central processing unit for generating a plurality of sensing signals and parameters data, and transmitting the sensing signals and parameters data to the central processing unit. The wireless communication module is electrically connected to the central processing unit, and converts the signals from the central processing unit into wireless signals. The antenna is electrically connected to the wireless communication module for transmitting the wireless signals.

An embodiment of the present disclosure provides a monitoring system for power transmission lines. The monitoring system for power transmission lines includes a plurality of sensing devices for power transmission lines, a plurality of gateway units, a remote monitoring center and a database. Each of the sensing devices includes a sensing circuit and is located on a power transmission line between two transmission towers. Each sensing device for power transmission lines detects a plurality of parameters data and a plurality of image signals. Each gateway unit receives a part of wireless signals transmitted from the sensing devices for power transmission lines. The remote monitoring center wirelessly communicates with the gateway units. A plurality of wireless communication signals is transmitted between the gateways and the remote monitoring center. The database is defined in the remote monitoring center for recording and storing the parameters data, the image signals and real-time data of the power transmission lines detected by the sensing device for power transmission lines.

According to the above-mentioned content, a sensing device and a monitoring system for power transmission lines using the sensing device are provided in the present invention, which the sensing device for a power transmission line with independent power source is defined therein. The sensing device for power transmission line can be easily mounted on the power transmission line and detached therefrom. The image data can be wirelessly transmitted to a remote monitoring center for monitoring. Moreover, multiple backup power sources are used in the monitoring system and the sensor device, such as solar photovoltaic module, the first battery or the second battery, etc. In addition, the video recording module, the illuminance sensor, the vibration sensor and the temperature-humidity sensor module are defined in the monitoring system and the sensing device for remotely monitoring, which can reduce the inconvenience of a site survey and save human resources.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain the principles of the present disclosure.

DESCRIPTION OF THE EXEMPLARY EMBODIMENTS

Figure 1:
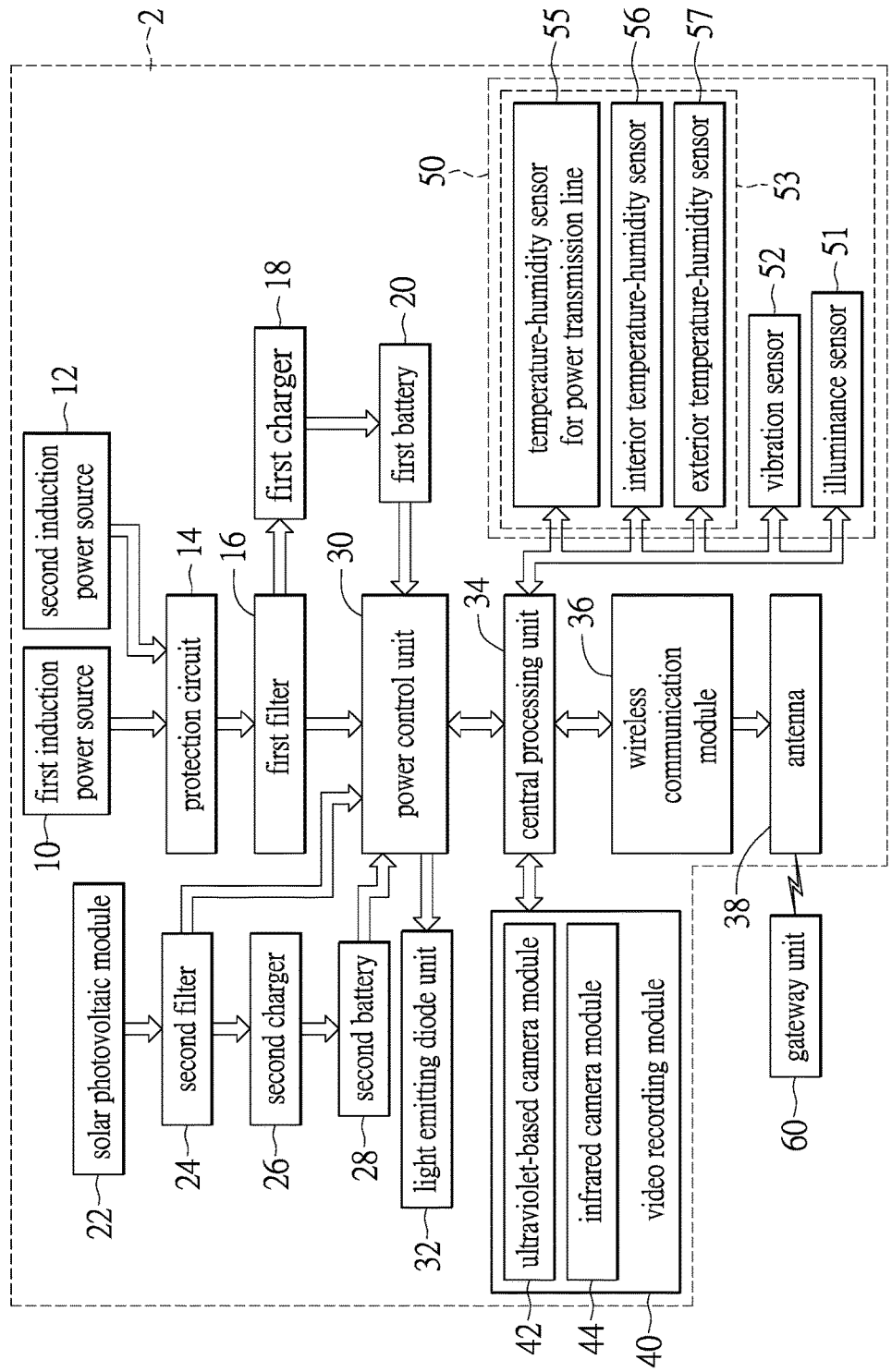
FIG. 1 is a schematic diagram of a sensing circuit according to an embodiment of the present disclosure invention.

Reference will now be made in detail to the exemplary embodiments of the present disclosure, examples of which are illustrated in the accompanying drawings. However, they may be embodied in different forms and should not be construed as limited to the embodiments set forth herein. These embodiments are provided so that this disclosure will be thorough and complete, and will fully convey the inventive concept to those skilled in the art. In the drawings, the thickness and relative thickness of layers and regions may be exaggerated for clarity. Similar constituent elements are generally designated with the same reference numerals throughout the specification.

It will be understood that, although the terms 'first', 'second', 'third', etc., may be used herein to describe various elements or signal, etc., these elements or signals should not be limited by these terms. The terms are used only for the purpose of distinguishing one component from another component, or one signal from another signal. In addition, as used herein, the term "or" includes any and all combinations of one or more of the associated listed items.

Figure 3:
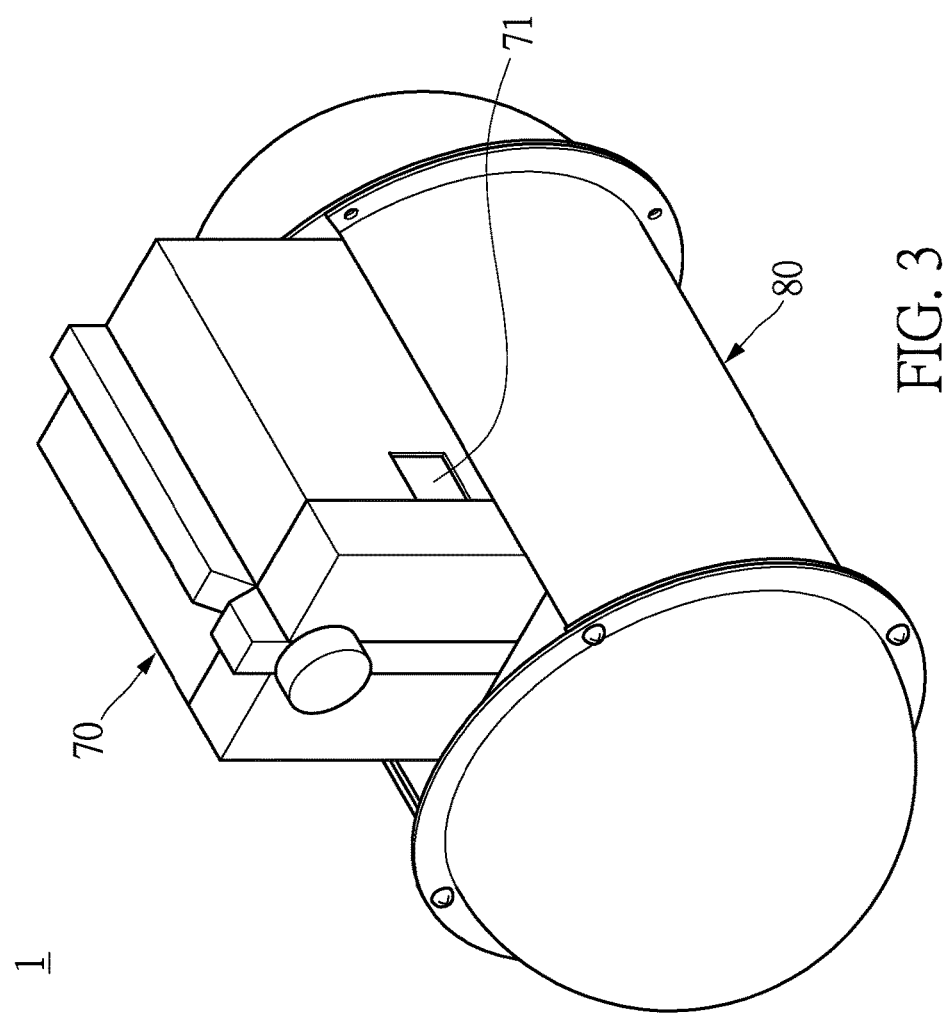
FIG. 3 is a perspective diagram of the sensing device for power transmission line according to an embodiment of the present disclosure.

FIG. 1 is a schematic diagram of a sensing circuit 2 of a sensing device for a power transmission line 1 (as shown in FIG. 3) according to an embodiment of the present disclosure invention. The sensing circuit 2 includes a first induction power source 10, a second induction power source 12, a protection circuit 14, a first filter 16, a first charger 18, a first battery 20, a solar photovoltaic module 22, a second filter 24, a second charger 26, a second battery 28 and a power control unit 30. The power control unit 30 is connected to a central processing unit 34 and a light emitting unit 32. The sensing circuit 2 further includes a wireless communication module 36, an antenna 38, a video recording module 40 and a sensor module 50. The light emitting unit 32 is electrically connected to the power control unit 30.

The first induction power source 10 and the second induction power source 12 generate electrical energy by electromagnetic induction. Even if the first induction power source 10 and the second induction power source 12 are disclosed in the embodiment, the number of the induction power sources is not limited thereto. The first induction power source 10 and the second induction power source 12 are used to provide electrical energy to the sensing circuit 2. The first induction power source 10 and the second induction power source 12 are electrically connected to the protection circuit 14. The protection circuit 14 is used to protect the sensing circuit 2 from the damage caused by a spike voltage, lightning, or an overcurrent situation. An output of the protection circuit 14 is electrically connected to the first filter 16 for filtering the induction power source. An output of the first filter 16 is electrically connected to the first charger 18 and the power control unit 30.

The first charger 18 is electrically connected to the first battery 20 for charging the first battery 20. The first battery 20 is used for a backup power source of the sensing circuit 2. When the power transmission line is malfunctioning, and the first induction power source 10 and the second induction power source 12 do not generate the electrical energy by electromagnetic induction, the first battery 20 is used for providing electrical energy to the sensing circuit 2 as a backup power source.

The solar photovoltaic module 22 defined in the sensing circuit 2 is used for another backup power source. An output of the solar photovoltaic module 22 is electrically connected to the second filter 24. An output of the second filter 24 is electrically connected to the second charger 26. The second charger 26 is electrically connected to the second battery 28 for charging the second battery 28. Namely, the electrical energy generated by the solar photovoltaic module 22 is not only provided to the power control unit 30 as a power source of the sensing circuit 2, but also used for charging the second battery 28. The output of the second battery 28 is electrically connected to the power control unit 30. The second battery 28 is used for one of the power sources of the sensing circuit 2. When the first induction power source 10 and the second induction power source 12 do not generate the electrical energy by electromagnetic induction, and the first battery 20 is run down, the second battery 28 is used for providing electrical energy to the sensing circuit 2 as a backup power source.

The power control unit 30 is electrically connected to the first filter 16, the first battery 20, the second filter 24 and the second battery 28. The central processing unit 34 receives the parameters data detected by the sensing devices for the power transmission line 1, and calculates a computation result. The power control unit 30 is used for switching the different power sources according to the computation result of the central processing unit 34. For example, the first battery 20 and the second battery 28 could be considered as backup power sources. When the first induction power source 10, the second induction power source 12, the first battery 20 and the second battery 28 cannot provide electrical energy, in the daytime the solar photovoltaic module 22 can provide electrical energy to the sensing circuit 2.

The central processing unit 34 is electrically connected to the power control unit 30 as a computation center for controlling the sensing circuit 2. The central processing unit 34 is electrically connected to the wireless communication module 36, the video recording module 40 and sensor module 50. The wireless communication module 36 is used for wirelessly transmitting the data of power transmission lines, image data, and the sensing signals received by the central processing unit 34 to a remote monitoring center. The wireless communication module 36 is further electrically connected to the antenna 38, and transmits the digital signals to the gateway unit 60 through the antenna 38.

The video recording module 40 is used for generating a plurality of image signals. The video recording module 40 includes an ultraviolet-based camera module 42 and an infrared camera module 44 for detecting optical phenomenon between the power transmission lines, which is caused by the electric arc, lightning, thunder, or spike etc. The optical phenomenon can include ultraviolet and infrared light, but is not limited thereto. The video recording module 40 is used for transmitting the image signals to the remote monitoring center to observe the conditions of the towers or the power transmission lines.

The sensor module 50 is used for detecting the environmental parameters and the operation parameters of the power transmission line. The sensor module 50 includes an illuminance sensor 51, a vibration sensor 52 and a temperature-humidity sensor module 53. The illuminance sensor 51 is used for detecting the illuminance of the environmental light. For example, the daytime illuminance can be detected for reference. The vibration sensor 52 is used for detecting the vibration level of the power transmission line or the sensing device for power transmission line 1, vertical displacement of the power transmission line, or displacement of the transmission tower. Practically, the vibration sensor 52 includes a three-axis accelerometer sensor, gyroscope, or a gravity sensor, but is not limited thereto. The temperature-humidity sensor module 53 includes a temperature-humidity sensor for power transmission line 55, an interior temperature-humidity sensor 56 and an exterior temperature-humidity sensor 57. The temperature-humidity sensor for power transmission line 55 is used for detecting the temperature and the humidity of the power transmission line. The interior temperature-humidity sensor 56 is used for detecting the temperature and the humidity of the interior of the sensing device for power transmission line 1. The exterior temperature-humidity sensor 57 is used for detecting the temperature and the humidity of the exterior of the sensing device for power transmission line 1. The above temperature and humidity detected by the temperature-humidity sensor for power transmission line 55, the interior temperature-humidity sensor 56 and the exterior temperature-humidity sensor 57 are provided to monitors to observe the temperature and the humidity of the power transmission line and interior or exterior of the sensing device for power transmission line 1.

Figure 2:
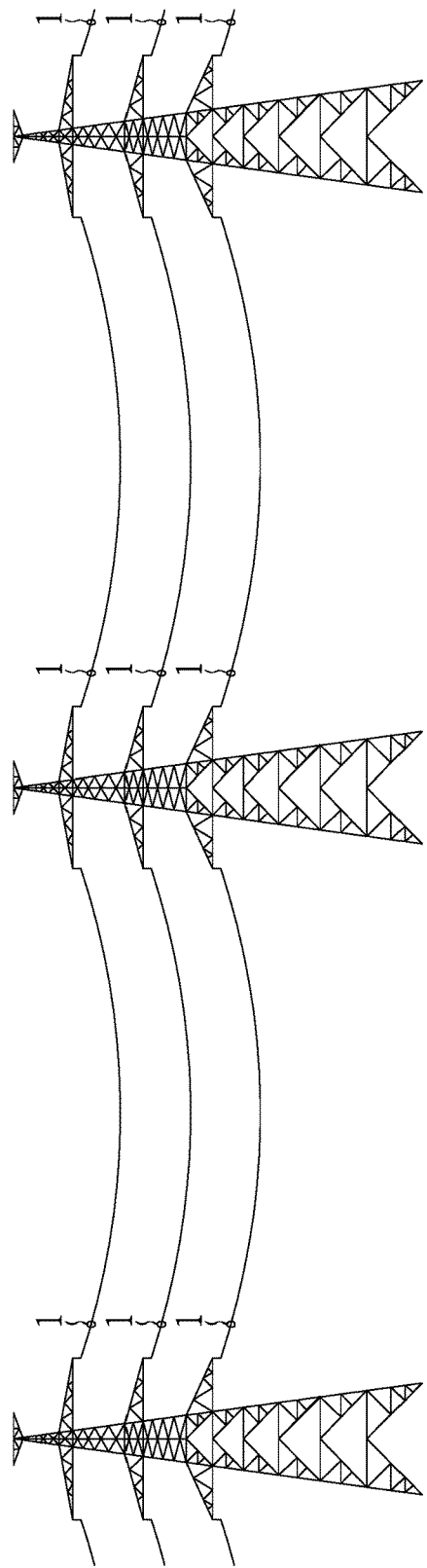
FIG. 2 is a schematic diagram of a sensing device for power transmission line according to an embodiment of the present disclosure, which is defined on a transmission line.

As shown in FIG. 2, the sensing device for power transmission line 1 is defined on the power transmission line. Each transmission line between two transmission towers has at least one sensing device for a power transmission line. The sensing device for a power transmission line 1 is used for detecting and monitoring the status parameters or image data of each power transmission line.

Figure 4A:
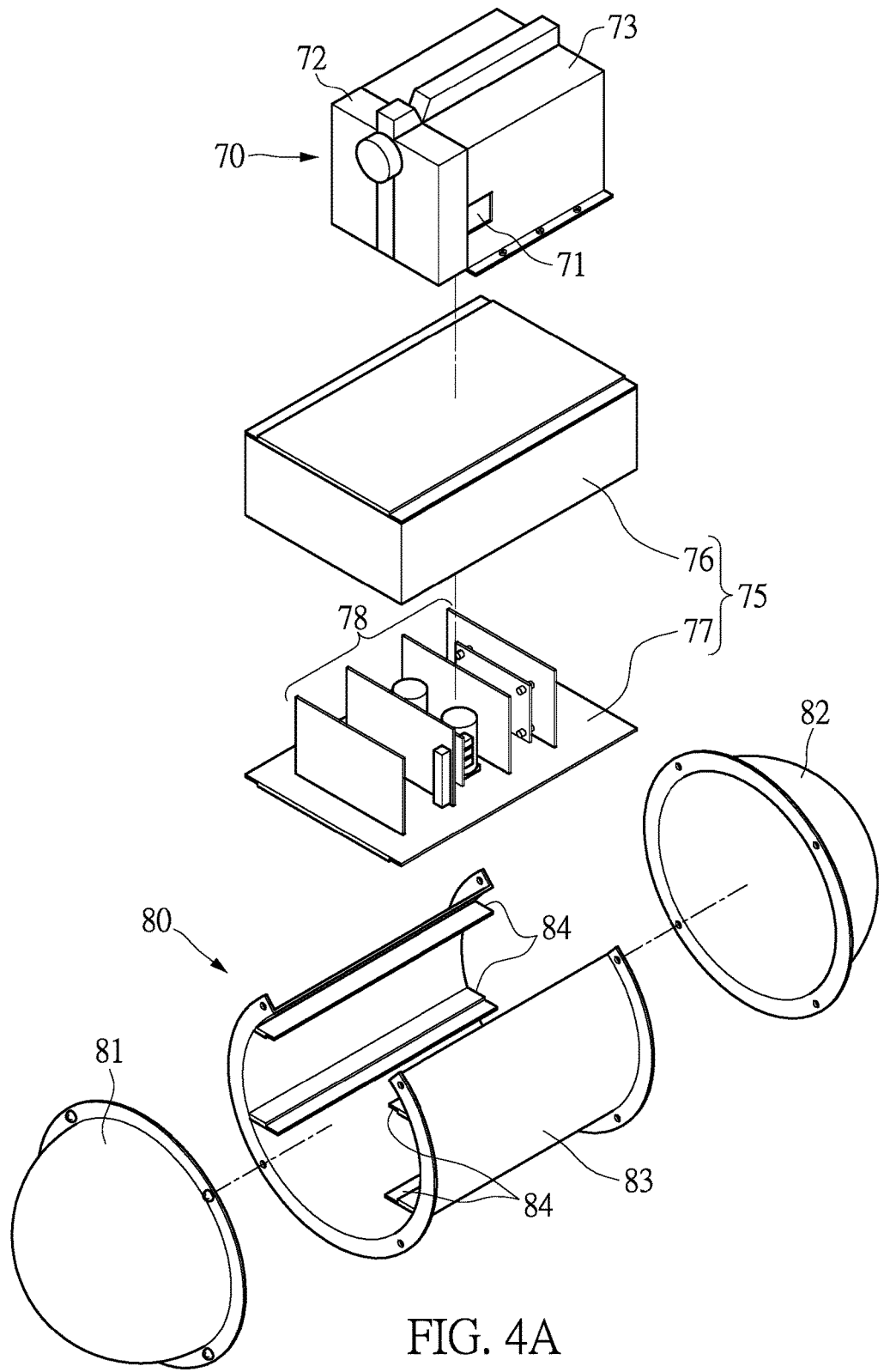
FIG. 4A is an exploded view of the sensing device for power transmission line of FIG. 3.

Referring to FIG. 3 and FIG. 4A, FIG. 3 is a perspective diagram of the sensing device for power transmission lines according to an embodiment of the present disclosure. FIG. 4A is an exploded view of the sensing device for power transmission lines of FIG. 3. The sensing device for power transmission lines 1 includes an induction coil device 70, including a hole for a power transmission line 71, a front device cover 72, a back device cover 73, and a sensing circuit device 75, including a cover 76, a bottom plate 77, a plurality of circuit boards 78 and a housing 80. The housing 80 includes a front cover 81, a back cover 82, a case 83 and a plurality of guide rails 84.

Figure 5A:
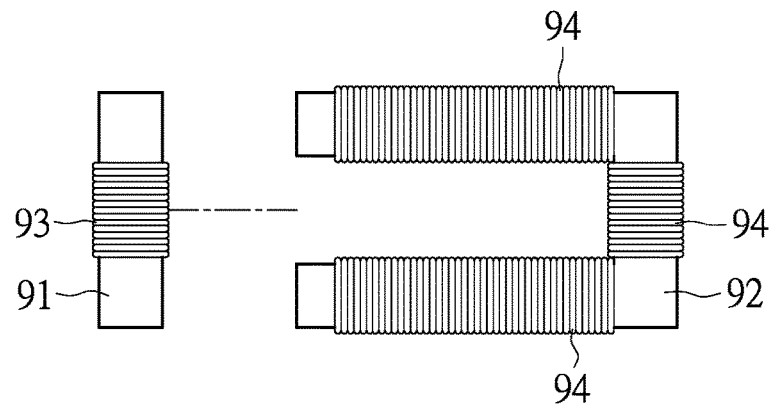
FIG. 5A is a schematic diagram of a set of iron cores and windings according to an embodiment of the present disclosure.
Figure 5B:
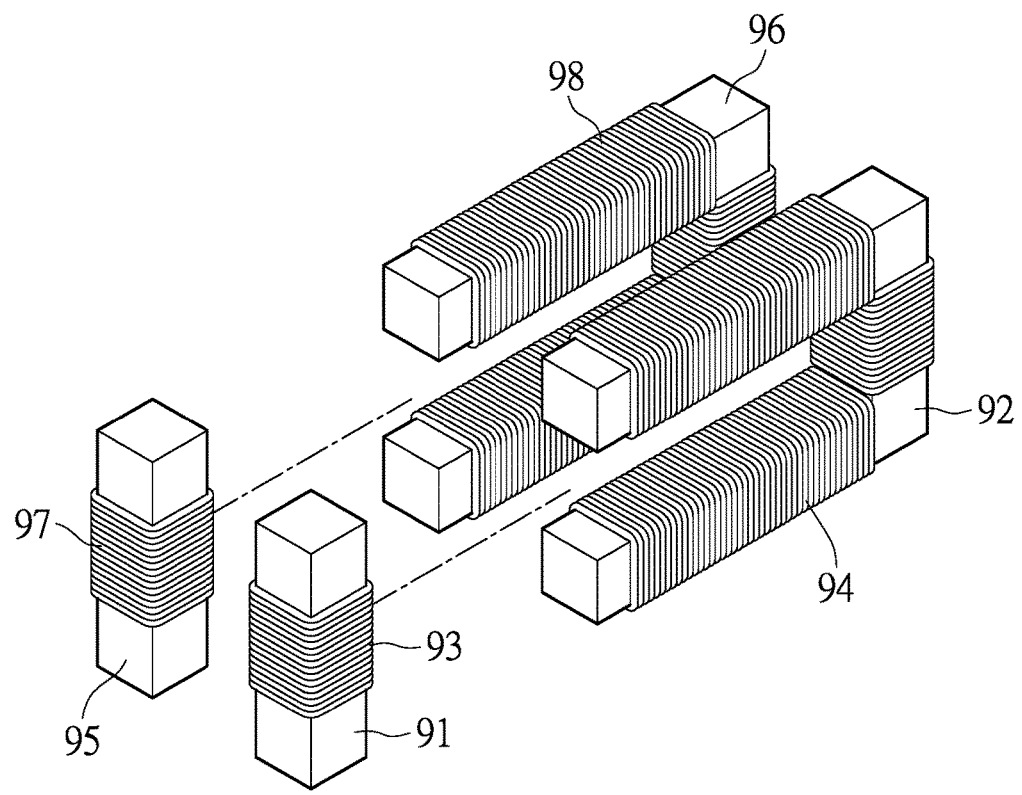
FIG. 5B is a schematic diagram of two sets of iron cores and windings according to an embodiment of the present disclosure.
Figure 6A:
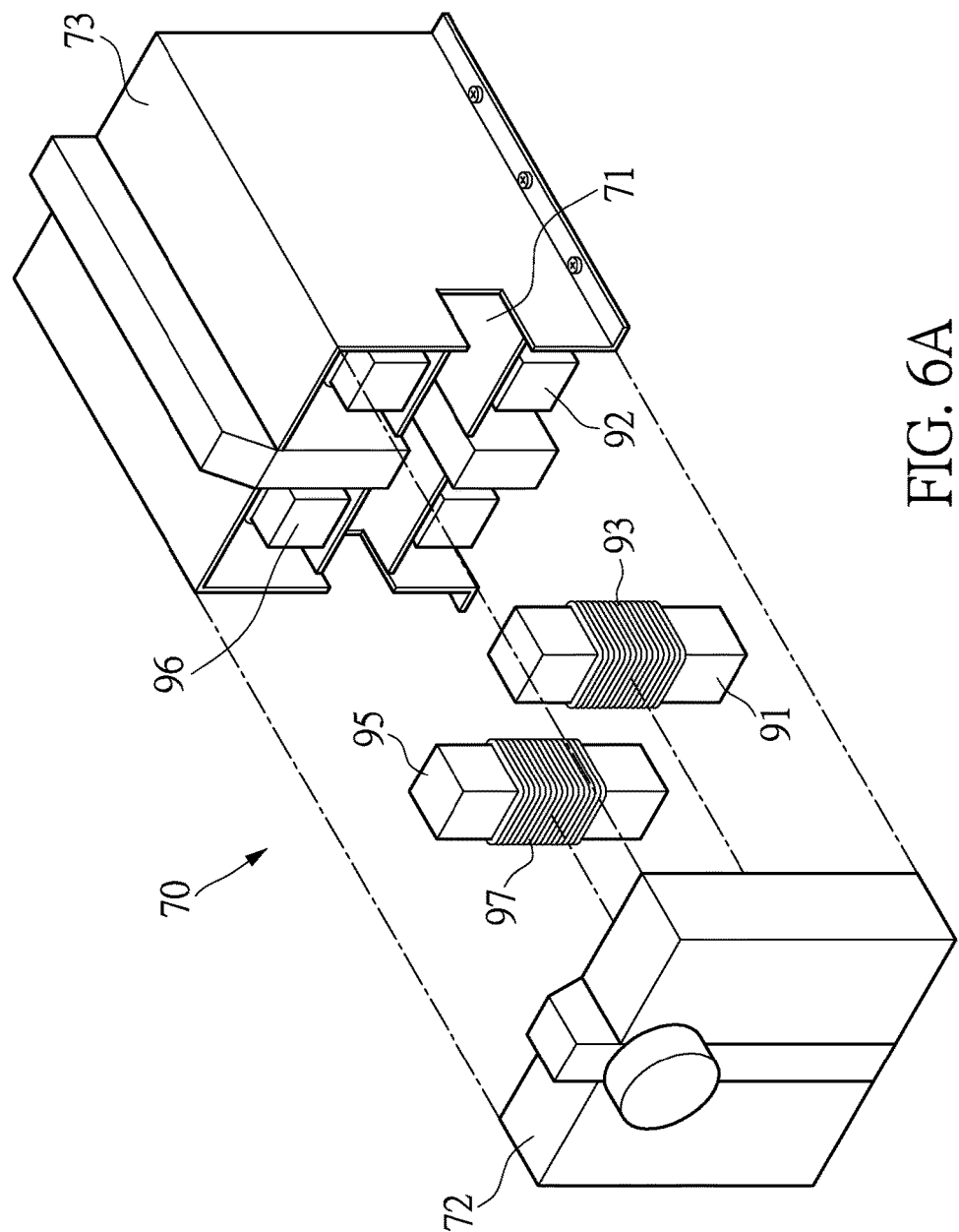
FIG. 6A is a schematic diagram of iron cores received in the induction coil device according to an embodiment of the present disclosure.
Figure 6B:
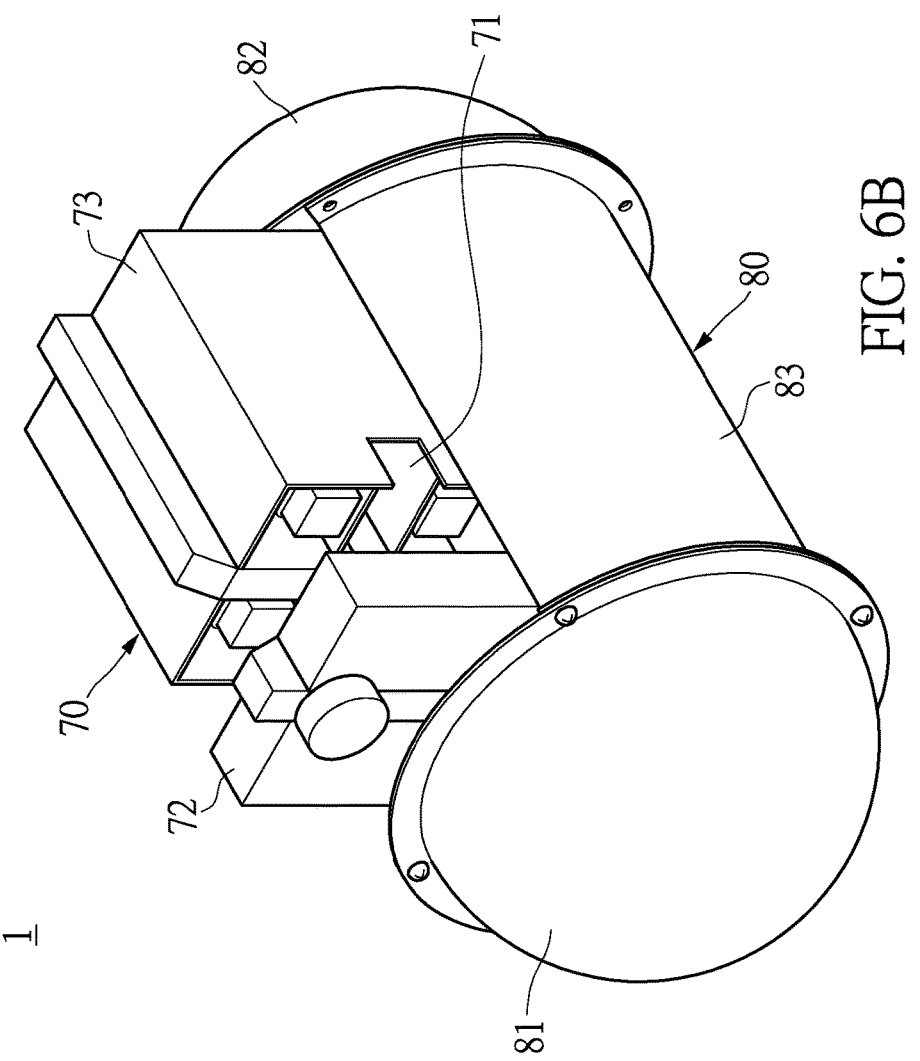
FIG. 6B is a schematic diagram of a front device detached from the induction coil device of the present disclosure.

The induction coil device 70 includes at least one set of induction coils. The details of the induction coils are described in the paragraphs for FIG. 5A and FIG. 5B. The hole for a power transmission line 71 is formed in the induction coil device 70 for receiving the power transmission line, such that the power transmission line current passes through the hole for a power transmission line 71. An induced current of the induction coil can be generated according to the power transmission line current. The induction coil device includes the front device cover 72 and the back device cover 73. Practically, the front device cover 72 is detached from the back device cover 73. The front device cover 72 can be detached from the sensing device for a power transmission line 1, such that the power transmission line can be received in the hole for power transmission line 71 (As shown in FIGS. 6A-6B). Therefore, the sensing device for a power transmission line 1 can be mounted on the power transmission line.

The sensing circuit device 75 is located in the housing 80. The sensing circuit device 75 includes a cover 76 and a bottom plate 77. The cover 76 and the bottom plate 77 cooperatively define an accommodation space with a box-shaped configuration. The circuit boards 78 are mounted on the bottom plate 77 in parallel. The cover 76 is mounted on the bottom plate 77 for receiving the circuit boards 78 in the sensing circuit device 75. The circuit boards 78 are defined corresponding to the function blocks as shown in the sensing circuit 2 of FIG. 1, namely, each of the function blocks in the sensing circuit 2 has a corresponding circuit mounted on the circuit boards 78. The ultraviolet-based camera module 41 and the infrared camera module 42 can be located at the exterior of the induction coil 70 for recording, which includes but is not limited to the exterior of the front device cover 72, back device cover 73 or other locations on the housing 80. Moreover, the image signals of the ultraviolet-based camera module 41 and the infrared camera module 42 can be transmitted to the central processing unit 34 of the circuit boards 78 for processing.

The front cover 81 and the back cover 82 of the housing 80 are hemispherical and have an arcuate configuration. A drag coefficient of the sensing device for power transmission line 1 can be reduced because of the streamline-shaped configuration of the hemispherical front cover 81 and the hemispherical back cover 82. Therefore, the vibrations of the sensing devices for the power transmission line 1 and the power transmission lines can be reduced. A case 83 is defined in the middle of the housing 80, which is hollow and similar to a barrel. A plurality of guide rails 84 are defined in the case 83. As shown in FIG. 4A, the guide rails are used for receiving the sensing circuit device 75.

Figure 4B:
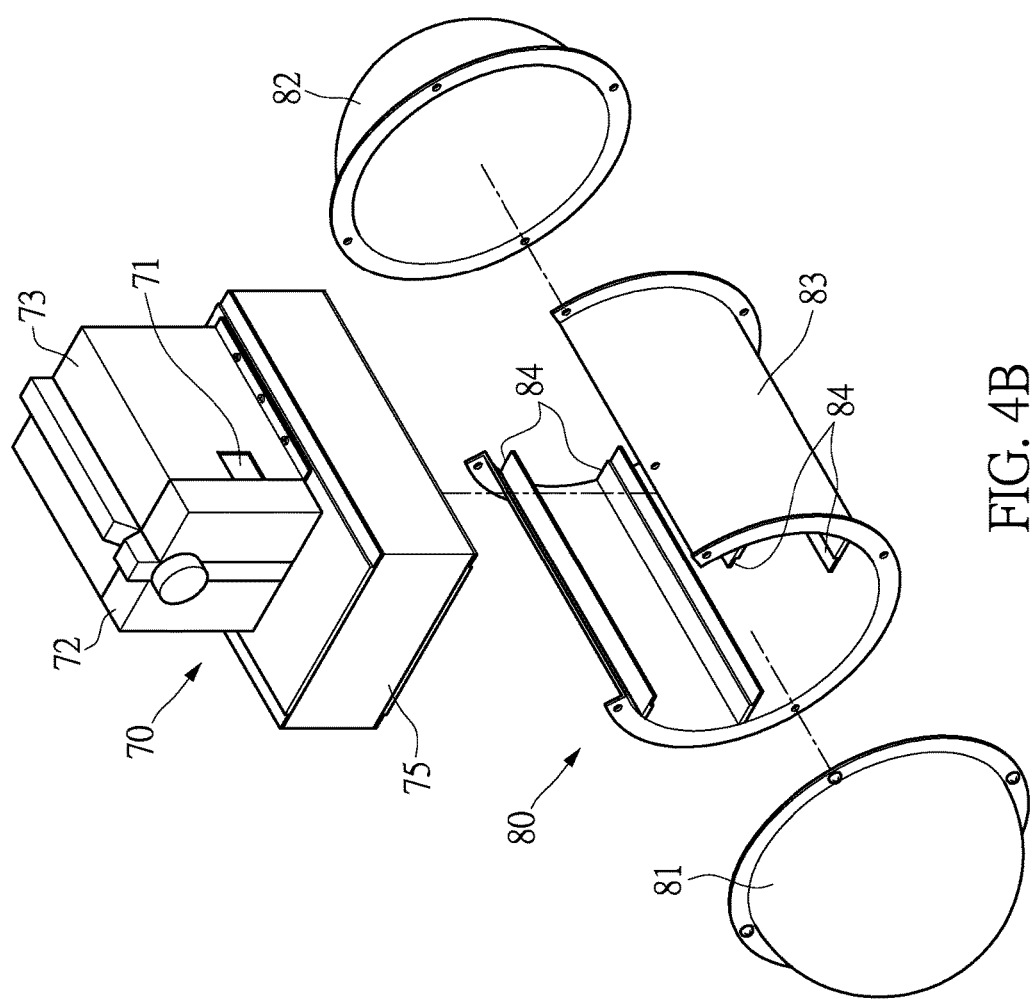
FIG. 4B is an assembling diagram of the induction coil device and a sensing circuit device.
Figure 4C:
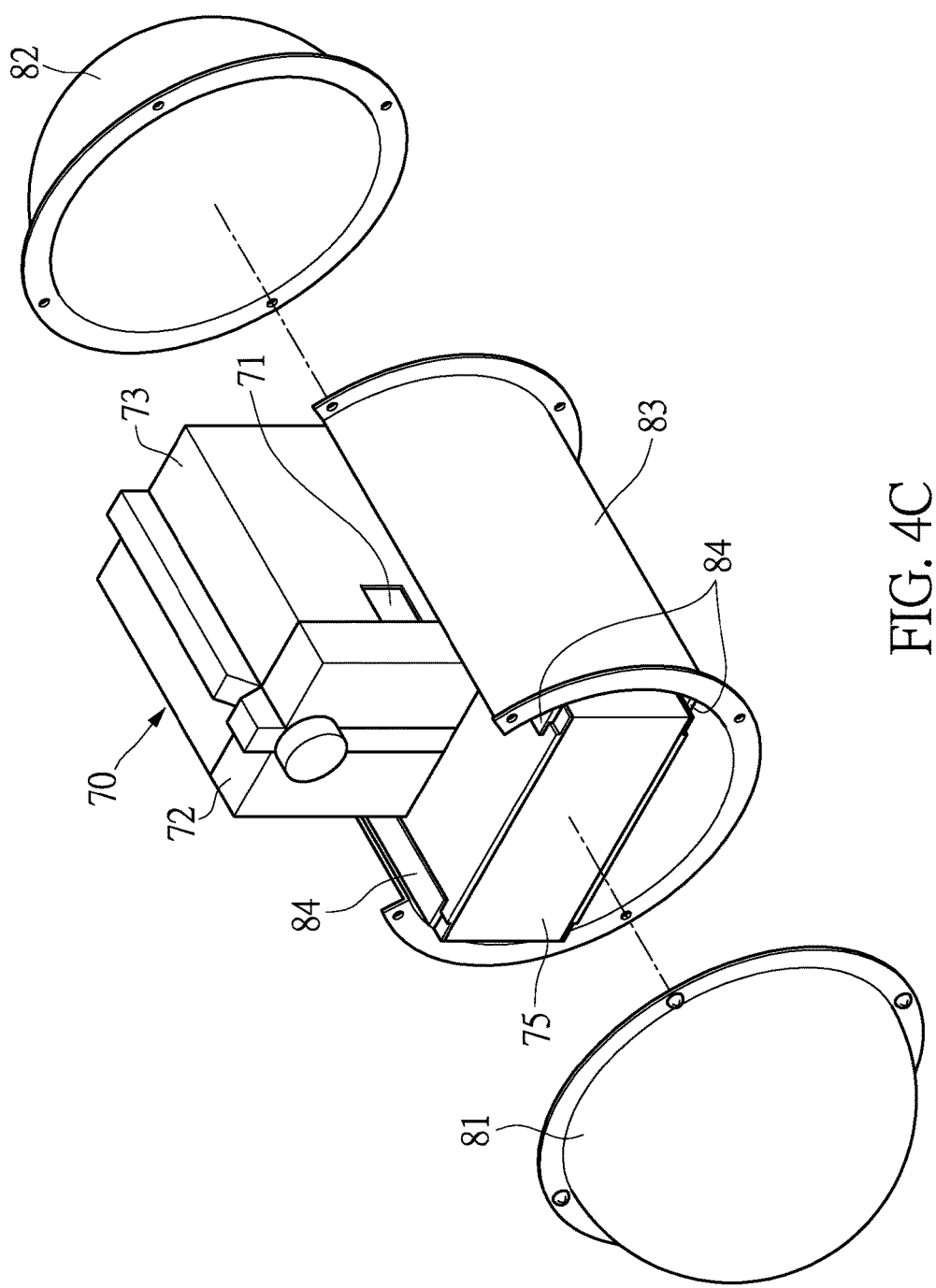
FIG. 4C is a schematic diagram of an assembly of the sensing circuit device mounted in the housing according to an embodiment of the present disclosure.

First, as shown in FIGS. 4A and 4B, the cover 76 is mounted on the bottom plate 77, and the circuit boards 78 can be received in the sensing circuit device 75. Next, the induction coil device 70 is mounted on an upper surface of the sensing circuit device 75. The induction coil as shown in FIG. 5A and FIG. 5B defined in the induction coil device 70 further includes a circuit board (not shown in the figures) electrically connected to the sensing circuit device 75 used for providing the electrical energy to the circuit board 78. As shown in FIG. 4C, the sensing circuit device 75 is received in two opposite guide rails 84. Next, the front cover 81 and the back cover 82 are respectively mounted on the two ends of the case 83 as shown in FIG. 3.

FIG. 5A is a schematic diagram of a set of iron cores and windings of the induction coil device 70. The induction coil device 70 includes a first iron core 91 and a second iron core 92 for cooperatively defining a closed loop path, which is considered as a flux path. Because the power transmission line is received in the sensing device for power transmission lines, the current of the power transmission line can pass through the flux path defined by the first iron core 91 and the second iron core 92. Namely, the current direction of the power transmission line is perpendicular to a surface of the flux path. Moreover, the first iron core 91 is straight. The second iron core 92 includes a first section, a second section and a third section. The first section is parallel to the third section, and the second section is connected between the first section and the third section in a U-shaped manner as shown in FIG. 5A. The first iron core 91 and second iron core 92 are called a UI lamination core by a person skilled in the art.

A first winding 93 is wound around the first iron core 91. A second winding is wound around the second iron core 92. By the electromagnetic induction between the current of the power transmission line and the flux path of the first iron core 91 and the second iron core 92, an induction current is generated in the first winding 93 and the second winding 94, which is considered as an induction power source. The first winding 93 and the second winding 94 includes a plurality of turns (1000 turns or 3000 turns), but the number is not limited thereto.

Different from FIG. 5A, there are two sets of iron cores and windings in FIG. 5B. A third iron core 95 and a fourth iron core 96 are further defined in the induction coil device 70 of FIG. 5B. The shape of the third iron core 95 is the same as that of the first iron core 91. The shape of the fourth iron core 96 is the same as that of the second iron core 92. Similarly, a third winding 97 and a fourth winding 98 are respectively wound around the third iron core 95 and the fourth iron core 96. By the electromagnetic induction between the current of the power transmission line and the flux path of the third iron core 95 and the fourth iron core 96, an induction current is generated in the third winding 97 and the fourth winding 98, which is considered as an induction power source. Similarly, the third winding 97 and the fourth winding 98 includes a plurality of turns (1000 turns or 3000 turns), but the number is not limited thereto.

As shown in FIG. 6A, the first iron core 91, the second iron core 92, the third iron core 95, the fourth iron core 96, the first winding 93, the second winding 94, the third winding 97 and the fourth winding 98 are mounted in the induction coil device 70. The first iron core 91, the first winding 93, the third iron core 95, the third winding 97 are located in the front cover 72. A pair of straight accommodation spaces are defined in the front cover 72 for receiving the first iron core 91 and the third iron core 95. Similarly, a pair of accommodation spaces are defined in the back cover 73 for receiving the second iron core 92 and the fourth iron core 96. The hole for power transmission line 71 is a gap defined at the back cover 73 corresponding to the openings of the second iron core 92 and the fourth iron core 96 for receiving the power transmission line, such that the current of the power transmission line can pass through the flux path defined by the first iron core 91, the second iron core 92, the third iron core 95 and the fourth iron core 96 to generate a plurality of induction power sources.

As shown in FIG. 6B, when the sensing device for power transmission line 1 is mounted on the power transmission line, the front device cover 72 can be detached from the back device cover 73 for receiving the power transmission line in the hole for the power transmission line 71.

Figure 7:
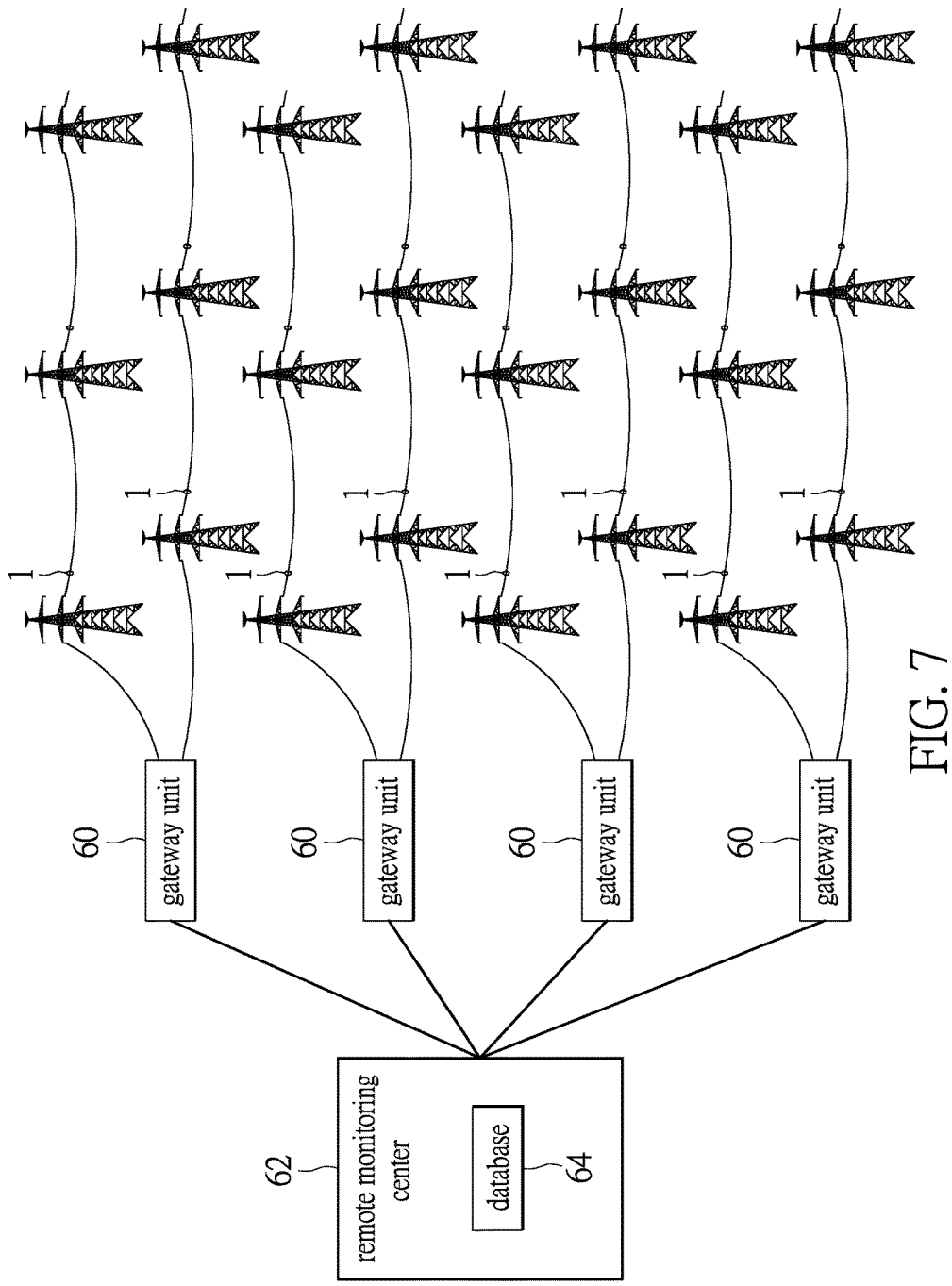
FIG. 7 is a schematic diagram of a monitoring system for power transmission line including the sensing device for power transmission line according to another embodiment of the present disclosure.

FIG. 7 is a schematic diagram of a monitoring system for power transmission line including the sensing device for power transmission lines 1 according to another embodiment of the present disclosure. The monitoring system includes a plurality of sensing devices for power transmission lines 1, a plurality of gateway units 60 and a remote monitoring center 62. Each sensing device for power transmission lines 1 includes the circuit diagram of the sensing circuit 2 as shown in FIG. 2 and is mounted on one power transmission line between two transmission towers. Each sensing device for power transmission lines 1 generates a plurality of parameter data and image signals. Each of the gateway units receives the wireless signals from some of the sensing devices for power transmission lines 1. As shown in FIG. 7, the transmission towers located in different rows are connected in series. The wireless communication signals from the sensing devices for power transmission lines of the same row can be transmitted to one gateway unit 60. Next, the multiple gateway units 60 are together connected to the remote monitoring center 62. The remote monitoring center wirelessly communicates with the gateway units 60. A plurality of wireless signals is transmitted between the remote monitoring center 62 and the gateway units 60. In another embodiment, cables can be used between the remote monitoring center 62 and the gateway unit 60 for transmitting the signals. The remote monitoring center 62 includes a database 64 for storing the plurality of parameter data and the image signals detected by the sensing devices for power transmission lines 1 and records the real-time status of the power transmission lines detected by the sensing devices for power transmission lines 1.

According to the above, a sensing device and a monitoring system for power transmission lines using the sensing device are provided in the present invention, where the sensing device for power transmission lines 1 with independent power sources is defined therein. The sensing device for power transmission lines 1 can be easily mounted on the power transmission line and detached therefrom. The image data can be wirelessly transmitted to remote monitoring center for monitoring. Moreover, multiple backup power sources are used in the monitoring system and the sensor device, such as solar photovoltaic module 22, the first battery 20 or the second battery 28, etc. In addition, the video recording module 40, the illuminance sensor 51, the vibration sensor 52 and the temperature-humidity sensor module 53 are defined in the monitoring system and the sensing device for remotely monitoring, which can reduce the inconvenience of conducting a site survey and save human resources.

The above-mentioned descriptions represent merely the exemplary embodiment of the present disclosure, without any intention to limit the scope of the present disclosure thereto. Various equivalent changes, alterations or modifications based on the claims of present disclosure are all consequently viewed as being embraced by the scope of the present disclosure.

What is claimed is:

1. A sensing device for a power transmission line, comprising:
an induction coil device, wherein a plurality of iron cores and a plurality of windings are defined in the induction coil device, the windings are wound around the iron cores, a hole for a power transmission line is defined at the induction coil device;
a sensing circuit device, for detecting operation status of a power transmission line and environmental parameters, the sensing circuit device comprising:
a cover; and
a bottom plate, wherein a plurality of circuit boards are mounted on the bottom plate, the induction coil device is mounted on one side of the cover; and
a housing, wherein each of two ends of the housing is of a streamline shape, and the housing is hollow for receiving the sensing circuit device;
wherein the iron cores of the induction coil device comprise at least one first iron core and at least one second iron core, the first iron core is straight, the second iron core comprises a first section, a second section and a third section, the second section is connected between the first section and the third section in a U-shaped manner; each of the windings is wound around each of the first iron cores or each of the second iron cores;
wherein the sensing circuit device including a sensing circuit which comprising:
a plurality of induction power sources;
a solar photovoltaic module;
a protection circuit connected to the plurality of induction power sources for avoiding a damage caused by a spike voltage, lightning, or an overcurrent situation;
a first filter connected to the protection circuit for filtering an output electrical energy from the plurality of induction power sources;
a second filter connected to the solar photovoltaic module for filtering an output electrical energy from the solar photovoltaic module;
a power control unit connected to the first filter and the second filter for controlling the electrical power energy provided to the sensing circuit;
a first battery connected to the power control unit for being as a first backup power source;
a second battery connected to the power control unit for being as a second backup power source;
a first charger connected between the first filter and the first battery for charging the first battery;
a second charger connected between the second filter and the second battery for charging the second battery;
a central processing unit connected to the power control unit for controlling the sensing circuit operation and executing computations thereof;
a video recording module connected to the central processing unit for generating a plurality of image signals and transmitting the image signals into the central processing unit;
a sensor module connected to the central processing unit for generating a plurality of sensing signals and parameters data, and transmitting the sensing signals and parameters data into the central processing unit;
a wireless communication module connected to the central processing unit for converting the signals from the central processing unit into wireless signals; and
an antenna connected to the wireless communication module for transmitting the wireless signals;
wherein the video recording module comprises:
an ultraviolet-based camera module generating ultraviolet-based image signals and transmitting the ultraviolet-based image signals to the central processing unit; and
an infrared camera module generating infrared image signals and transmitting the infrared image signals to the central processing unit.

2. The sensing device for a power transmission line of claim 1, wherein the induction coil device comprises a front device cover and a back device cover, the front device cover is used for receiving the first iron cores, the back device cover is used for receiving the second iron core, the hole for a power transmission line is defined at one side of the back device, the front device cover is detachably mounted on the back device cover for receiving the power transmission line in the hole for power transmission line, such that the sensing device for power transmission line is mounted on the power transmission line.

3. The sensing device for power transmission line of claim 1, wherein the two ends of the housing are hemispherical.

4. The sensing device for power transmission line of claim 1, wherein a plurality of guide rails are defined in the housing for receiving the sensing circuit device.

5. The sensing device for power transmission line of claim 1, wherein the sensor module comprises:
an illuminance sensor for detecting environmental light;
a vibration sensor for detecting vibrations, sag status and displacements in different directions of the power transmission line; and
a temperature-humidity sensor for detecting temperatures and a humidity.

6. The sensing device for power transmission line of claim 1, wherein the temperature-humidity sensor module comprises:
a temperature-humidity sensor detecting both of the temperatures and humidity of a power transmission line;
an interior temperature-humidity sensor detecting both of the temperatures and humidity of the interior of the sensing device;
an exterior temperature-humidity sensor detecting both of the temperatures and humidity of the exterior of the sensing device.

7. The sensing device for power transmission line of claim 1, further comprising a light emitting diode unit electrically connected to the power control unit.

* * * * *